United States Patent [19]
Rodriguez

[11] Patent Number: 5,986,498
[45] Date of Patent: Nov. 16, 1999

[54] AUDIO DIRECT FROM POWER SUPPLY

[75] Inventor: Manuel D. Rodriguez, El Paso, Tex.

[73] Assignee: Harman International Industries, Incorporated, Northridge, Calif.

[21] Appl. No.: 09/060,153

[22] Filed: Apr. 14, 1998

[51] Int. Cl.[6] .................................................... H03F 3/38
[52] U.S. Cl. ........................................ 330/10; 330/207 A
[58] Field of Search ................................ 330/10, 207 A, 330/251

[56] References Cited

U.S. PATENT DOCUMENTS

| | | | |
|---|---|---|---|
| 4,573,018 | 2/1986 | Mirow | 330/10 |
| 5,115,205 | 5/1992 | Holmes, Jr. | 330/10 |
| 5,117,198 | 5/1992 | Morenz | 330/251 |

*Primary Examiner*—Robert Pascal
*Assistant Examiner*—Henry Choe
*Attorney, Agent, or Firm*—Jones, Day, Reavis & Pogue

[57] ABSTRACT

A novel circuit that generates direct audio from a power supply that uses no power amplifier and that can provide full isolation to any impedance load. It has no power amplifier output stage and has a zero signal-to-noise ratio when there is no signal input because the circuit is designed with MOSFETS that do not conduct unless there is a signal input.

16 Claims, 2 Drawing Sheets

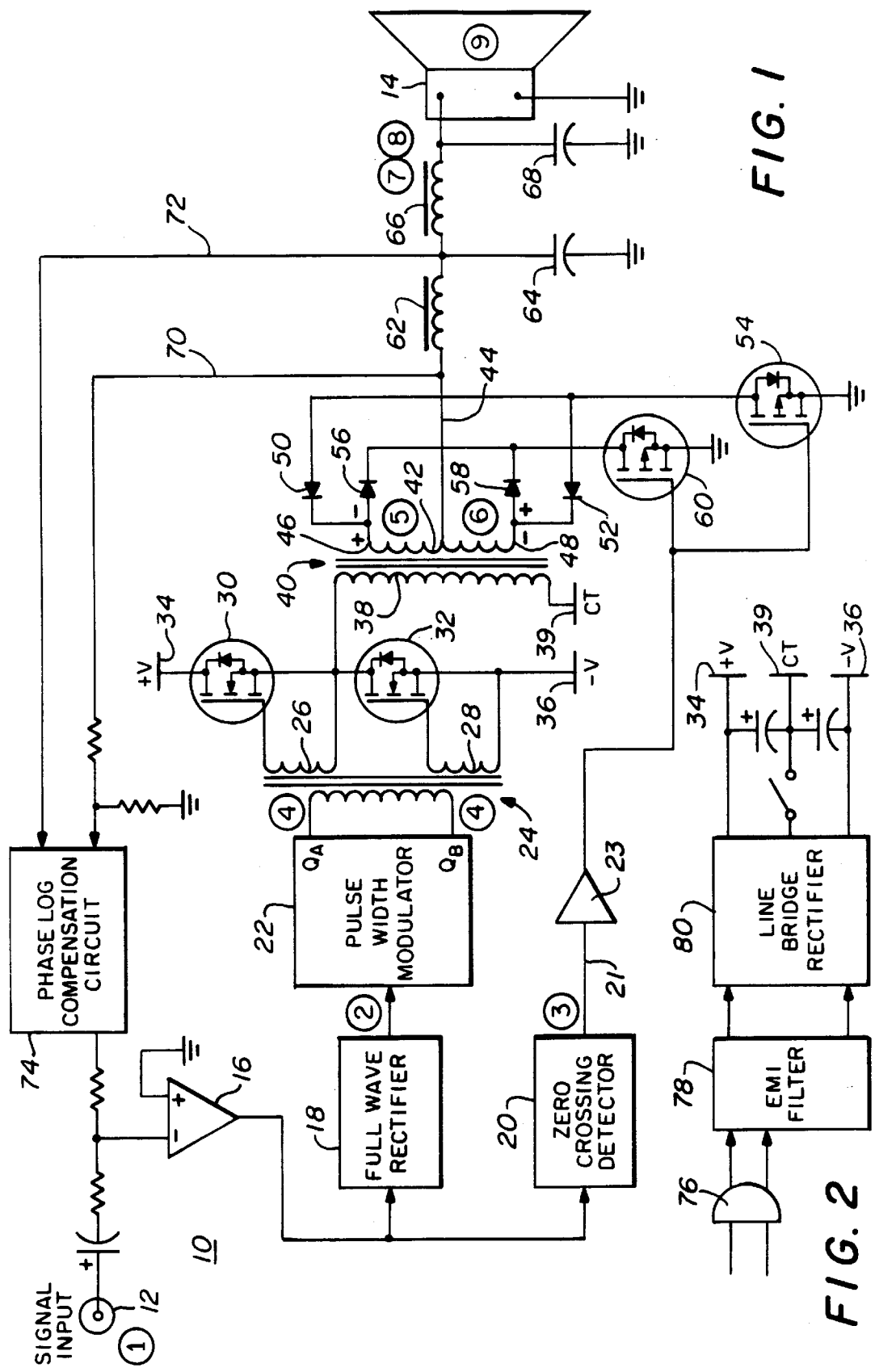

AUDIO DIRECT FROM POWER SUPPLY

BACKGROUND OF THE INVENTION

1. Field of the Invention

The present invention relates in general to audio amplifiers and in particular a method and apparatus for obtaining off-line direct audio from a power supply without the use of a relatively high-power amplifier circuit.

2. Description of Related Art Including Information Disclosed Under 37 CFR 1.97 and 1.98

Audio circuits are well known in the prior art and generally utilize an audio amplifying circuit to drive the audio speaker. The audio amplifier is required to a be power audio stage. Such power amplifier circuits are illustrated in U.S. Pat. Nos. 4,409,559 and 4,651,112.

A typical class AB audio amplifier has a power supply and the audio amplifier. The cost of these two units together is significant in the manufacture of an audio output device. There are many switching power amplifiers that attempt to avoid the requirement of an audio power amplifier in the circuit.

Such circuits are shown in U.S. Pat. Nos. 4,763,080, 4,517,522, 4,047,120 and 4,453,131.

Class D amplifiers are always switching at fifty percent duty cycle even when no signal is applied. This causes an inherent noise that increases the signal-to-noise ratio when no signal is applied.

It would be advantageous to have a highly efficient effective audio output circuit deriving its energy from a power supply and avoiding the requirement of having an expensive audio amplifier as the final stage.

SUMMARY OF THE INVENTION

The present invention relates an off-line direct audio circuit utilizing the power supply and not requiring a power amplifier output stage. Because all power is delivered directly to the audio speaker from a switching transformer that provides a modulated signal obtaining variable voltages, there is no traditional audio stage like AB or Class D amplifiers.

In the present invention, the audio input signal is applied to an error amplifier with a traditional feedback circuit. The input signal is full-wave rectified after the error amplifier. A pulse-width modulator circuit modulates the signal from the full-wave rectifier and that signal is coupled to a high-powered switching circuit. The high-powered switching circuit comprises a gate-drive unit isolated from the pulse-width modulator with a transformer and an output switching power transformer that transforms modulated high voltage/low current on the input to a modulated low voltage/high current on the output. Because the audio signal has been pulse-width modulated, the signal polarity at the output of the switching power transformer must be determined. Therefore, a zero-crossing detector is utilized to determine the zero crossings of the input audio signal. Those signals are coupled to first and second switches that gate the proper signal polarity outputs of the switching power transformer. The outputs are then filtered with a low-pass filter to remove the modulation signal and generate the audio output signal having sufficient amplitude to drive the speaker. A phase-lag compensation from the feedback circuit is coupled to the input signal and the error amplifier to prevent oscillations of the circuit.

This circuit needs no power audio stage, is extremely efficient due to high voltage on the switching gates, and has a cost about one-half with respect to traditional Class AB power amplifier circuits. Further, when no audio signal is applied, there are no pulses from the pulse-width modulator and thus the signal-to-noise ratio is zero because there is no idle current that flows.

Thus, it is an object of the present invention to provide a direct audio output signal from a power supply.

It is another object of the present invention to pulse-width modulate an input audio signal and to use the pulse-width modulation to drive isolated gates that have a high voltage applied thereto and low current and then utilize an output transformer for switching the high voltage/low current pulse-modulated voltage to a low voltage/high current signal on the output of the transformer that can be properly detected with a switching, circuit and then demodulated to provide the audio output signal for driving the speaker.

It is still another object of the present invention to use MOSFETS for the gates utilizing the high voltage and low current inasmuch as the MOSFET devices are more efficient because lower current represents lower losses due to the internal resistance of the MOSFETS.

Further, it is an object of the present invention to provide power MOSFETS that do not switch when there is no input audio signal thus having a zero signal-to-noise ratio when no signal is applied.

It is still another object of the present invention to provide a direct audio from the power supply using an off-line system wherein the power supply is connected to AC line or the AC mains.

Thus, the present invention relates to a method of obtaining off-line direct audio from the power supply comprising the steps of receiving an input audio signal, modulating a power supply voltage with the input audio signal, the power supply voltage being sufficient to drive an audio speaker, coupling the modulated power supply voltage to a filter circuit to recover the audio signal and driving the audio speaker with the recovered audio signal without further amplification.

The invention also relates to apparatus for obtaining off-line direct audio directly from a power supply comprising a terminal for receiving an audio input signal, a voltage source having sufficient voltage of first and second polarity to drive the audio output speaker, a modulator for modulating the voltage from the voltage source with the audio input signals on the terminal, and a filter circuit for recovering the audio signal and providing a driving voltage sufficient to cause the audio signals to be reproduced by the audio output speaker.

BRIEF DESCRIPTION OF THE DRAWINGS

These and other features of the present invention will be more fully disclosed when taken in conjunction with the following Detailed Description of the Preferred Embodiment(s) in which like numerals represent like elements and in which:

FIG. 1 is a block diagram of the novel audio circuit;

FIG. 2 is a block diagram of the power supply forming a part of the novel circuit of FIG. 1;

DETAILED DESCRIPTION OF THE PREFERRED EMBODIMENT(S)

FIG. 1 illustrates the novel audio drive circuit 10 in block diagram form. The audio input signal at terminal 12 (FIG.

Figure 3:
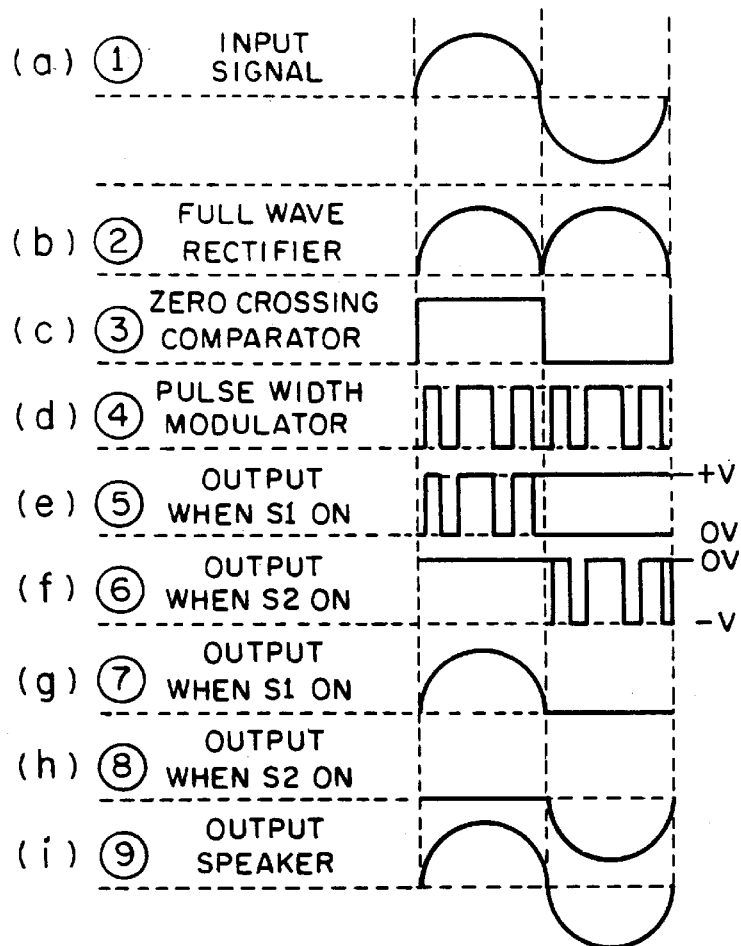
FIG. 3 is a waveform diagram illustrating the various waveforms at particular points in the circuit of FIG. 1.

3a) is coupled through the novel circuit 10 to drive the audio speaker 14 (FIG. 3i). The signal passes through an error amplifier 16 into a full-wave rectifier 18 and a zero-crossing detector 20. From the full-wave rectifier the input signal shown in FIG. 3(a) is rectified to that waveform shown in FIG. 3(b). The signal from the full-wave rectifier 18 is coupled to a pulse-width modulator 22 that generates the output shown in FIG. 3(d) to the input winding of transformer 24. It will be appreciated by those skilled in the art that, although a pulse-width modulator 22 is described in the preferred embodiment set out below, other types of modulation such as frequency modulation or phase modulation may be selected rather than pulse-width modulation.

Transformer 24 serves to isolate the power MOSFET gates 30 and 32 from the pulse-width modulator circuit 22. The positive and negative voltages from the power supply (shown in FIG. 2) on terminals 34 and 36 are coupled to terminals 34 and 36 shown in FIG. 1 as an input to the MOSFETS 30 and 32. The MOSFETS 30 and 32 are triggered by the pulse-width modulated signals from modulator 22 through Transformer windings 26 and 28. Because there is a high voltage coupled to the power terminals 34, 36 of the MOSFETS, there is a high voltage and low current through the MOSFETS. This is advantageous since the MOSFETS are used as high-frequency switches and the internal resistance when they are conducting can be analoged to the contact resistance of any switch. Since the power losses are dependent of the RMS current passing through the MOSFETS and the internal ON resistance, the losses caused by the MOSFET internal resistance in the ON state are minimal because of the low current. Since the positive 160 volts is coupled to the MOSFET 30 and negative 160 volts is connected to the MOSFET 32, MOSFET 30 gates the positive-going pulse-width modulated signals to the input winding 38 of switching power transformer 40. In like manner, MOSFET 32 switches the negative-going pulse-width modulated pulses to the input winding 38 of switching power transformer 40. Thus the gates 30 and 32 are alternately switched ON by the first and second polarity pulse-width modulated signals.

Power transformer 40 transfers the energy to the filter demodulator formed by inductors 62 and 66 and capacitors 64 and 68.

Since there are positive and negative-going pulse-width modulated signals being applied to transformer 40, the output must be gated so that at the proper time the positive pulses are transferred to the filter demodulator and at the proper time the negative pulses are transferred to the filter demodulator. In order to do that, the zero-crossing detector 20 produces signals on line 21 that are coupled through buffer 23 to switches 54 and 60. These zero-crossing detector signals gate either switch 54 or switch 60 to enable the proper signals to be taken off the center tap 44 of secondary winding 42 of the power transformer 40. See the wave shapes 3(e) and 3(f).

The filter demodulator comprises inductors 62 and 66 and capacitors 64 and 68. When switch 60 is conducting, the positive pulses are demodulated and shown as the signal in FIG. 3(g). When switch 54 is ON, the negative pulses are demodulated and are shown as the signal in FIG. 3(h). The composite signal that is applied to the speaker 14 is shown in FIG. 3(i).

FIG. 2 illustrates in block diagram the power supply that is coupled to the MOSFETS 30 and 32 and transformer winding 38 of the switching power transformer 40. The line voltage at 76 is coupled to an electromagnetic interference filter 78 and then to a line bridge rectifier 80. The outputs produced are +160 volts on terminal 34, −160 volts on terminal 36, and the center tap at terminal 39.

Figure 4:
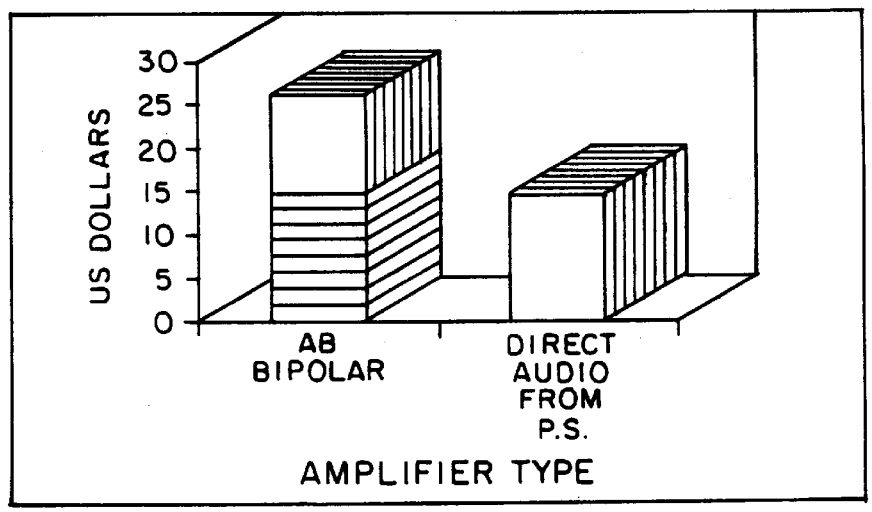
FIG. 4 is a graph illustrating the cost of a typical prior art 100-watt AB audio amplifier as compared with the cost of the present circuit where direct audio is obtained directly from the power supply.

There are several advantages to the novel off-line direct audio from power supply circuit. First, no power audio stage is needed. Further, a better efficiency is obtained due to the high voltage on the AC power line 76. Third, the cost of the completed audio speaker driver circuit is about one-half the traditional Class AB amplifier circuit. Note, in FIG. 4, that the cost for 100-watt audio amplifier for an AB bipolar system is approximately $26. About $14 of that is for the amplifier and approximately $12 is for the power supply. Note that the novel circuit for obtaining direct audio from the power supply costs approximately $14. Thus, there is a great advantage to utilizing the present circuit to generate the audio signals for driving the audio speaker. Further, when there is no audio signal applied, there is no output from the pulse-width modulator 22 and thus the MOSFETS 30 and 32 are not conducting. Therefore the signal-to-noise ratio is zero because there is no current flowing through the MOSFETS 30 and 32 when there is no signal input. This is not the case in the traditional amplifiers when there is noise generated by the amplifiers even though no signal is applied because they are still conducting without a signal input.

Thus, there has been disclosed a novel circuit for a power supply that is connected directly to the AC line or AC main and that generates direct audio from the power supply to drive an audio speaker. All power is delivered directly from a switching transformer where the modulated audio signal is recovered to provide an output that drives the speaker after being demodulated. There is no traditional audio stage such as in conventional Class AB or Class D audio amplifiers. Further, by utilizing an isolating transformer and a switching power transformer, the current through MOSFETS is lower and is determined by the turns ratio of the switching transformer. MOSFET devices are more efficient because lower current represents lower losses due to the ON resistance of the devices. Thus, where high voltages are involved, there are low currents and the switching power transformer because of its turns ratio generates an output that has lower voltage and higher current. Finally, because the power MOSFETS conduct only when there is a signal input, the signal-to-noise ratio is zero when there is no signal because there is no current passing through the MOSFETS and, thus, no output current.

The corresponding, structures, materials, acts, and equivalents of all means or step plus function elements in the claims below are intended to include any structure, material, or act for performing the function in combination with other claimed elements as specifically claimed.

I claim:

1. A method of obtaining off-line direct audio from a power supply comprising the steps of:
   receiving an input audio signal;
   modulating said input audio signals;
   coupling said modulated input audio signals to the input winding of an isolating transformer having a first voltage magnitude input winding and first and second output windings having a second larger voltage than on said input winding;
   coupling a first gate between one end of said first output winding and a first power supply voltage;
   coupling a second gate between one end of the second high-voltage output winding and a second power supply voltage such that the first and second gates are alternately switched ON because of the polarity of said modulated input audio signals;

coupling the increased output voltage on each of said first and second output windings to a filter circuit to recover the audio signal; and driving said audio speaker with said recovered audio signal without further amplification.

2. A method of obtaining off-line direct audio from a power supply comprising the steps of:

receiving an input audio signal;

full-wave rectifying said input audio signal;

converting said full-wave rectified input audio signal into a pulse-width modulated audio signal;

modulating an isolated power supply voltage with said pulse-width modulated audio signal, said power supply voltage being sufficient to drive an audio speaker;

detecting zero crossings of said audio signal and generating corresponding signals;

coupling said modulated power supply voltage to the input winding of a switching power transformer that produces a reduced voltage and increased current on the output winding; and gating the output audio signals from the output winding of said switching power transformer with said detected zero crossing signals of said input audio signal to provide pulse-width modulated signals to a filter circuit having sufficient voltage amplitude to drive said audio output speaker without further amplification.

3. The method of claim 2, wherein the step of modulating said power supply voltage with said pulse-width modulated audio signal further comprises the steps of:

coupling said pulse-width modulated audio signals to the primary winding of an isolating transformer that has a primary winding and first and second secondary windings;

coupling a first power gate between said power supply voltage source and a first one of said isolating transformer secondary windings for passing the pulse-width modulated audio signals of a first polarity that are applied to the primary winding of said isolating transformer;

coupling a second power gate between said power supply voltage source and the second one of said isolating transformer secondary windings for passing the pulse-width modulated audio signals of a second polarity opposite to the first polarity of the pulse-width modulated signals that are applied to the primary windings of said isolating transformer; and coupling the power supply voltage that is modulated with said first and second polarity pulse-width modulated signals to the input winding of the switching power transformer.

4. The method of claim 3, wherein the step of gating the audio output of the switching power transformer further comprises the steps of:

a first switch coupled to the output winding of said switching power transformer for gating said pulse-width modulated audio signals of the first polarity to said filter circuit when activated by said detected zero crossing signals; and a second switch coupled to the output winding of said switching power transformer for gating pulse-width modulated audio signals of the opposite polarity to the filter circuit when activated by said detected zero crossing signals.

5. The method of claim 1 further including the step of modulating said power supply voltage with pulse-width modulated input audio signals.

6. The method of claim 1 further including the step of modulating said power supply voltage with frequency-modulated input audio signals.

7. The method of claim 1 further including the step of modulating said power supply voltage with phase-modulated input audio signals.

8. The method of claim 1 wherein the step of modulating the power supply voltage with said input audio signals further comprises the steps of:

modulating said input audio signals;

coupling said modulated input audio signals to the input winding of an isolating transformer having a first voltage magnitude input winding and first and second output windings having a second larger voltage than on said input winding;

coupling a first gate between one end of said first output winding and a first power supply voltage;

coupling a second gate between one end of the second high-voltage output winding and a second power supply voltage such that the first and second gates are alternately switched ON because of the polarity of said modulated input audio signals; and coupling the increased output voltage on each of said first and second output windings to said filter circuit to recover the audio input signal.

9. The method of claim 1 wherein the step of coupling the increased output voltage on each of said first and second output windings of said isolation transformer to said filter circuit further comprises the steps of:

coupling the output of each one of said first and second gates to the input winding of a power transformer having an input winding for receiving said increased output voltage and an output winding generating an output voltage lower than the voltage on the input winding;

coupling a first switch to said power transformer output winding for passing pulse-width modulated signals of a first polarity;

coupling a second oppositely polled switch to said power transformer output winding for passing pulse-width modulated signals of a second polarity; and coupling an input audio signal zero crossing detector to said first and second switches to cause said switches to alternately conduct and transfer all power directly from said power transformer to said filter circuit for driving and said audio speaker without further amplification.

10. Apparatus for obtaining off-line direct audio directly from a power supply comprising:

a terminal for receiving audio input signals;

a power supply voltage having sufficient voltage of first and second polarity to drive an audio output speaker;

a full-wave rectifier for rectifying said audio input signals;

a modulator for modulating said rectified audio input signals;

an isolating transformer having a first voltage input winding for receiving said modulated audio input signals and a second winding coupled to the power supply voltage;

a first gate coupled between the isolating transformer first output winding and said power supply voltage for modulating said first polarity power supply voltage;

a second gate coupled between the isolating transformer second output winding and said power supply voltage for modulating said second polarity power supply voltage;

a switching power transformer having an input winding and an output winding;

a filter circuit for recovering said audio signals coupled to the output winding of said switching power transformer for providing a driving voltage sufficient to cause said audio signals to be reproduced by said audio output speaker; and said first and second gates having outputs commonly coupled to the input winding of said switching power transformer for transferring said modulated power supply voltage to said filter circuit.

11. The apparatus of claim 10 wherein said modulator is a pulse-width modulator.

12. The apparatus of claim 10 wherein said modulator is a frequency modulator.

13. The apparatus of claim 10 wherein said modulator is a phase modulator.

14. The apparatus of claim 10 wherein said switching power transformer comprises:

a power transformer having a first voltage input winding and a second step-down voltage output winding;

first and second ends on said first voltage input winding;

first and second ends and a center tap on said second step-down voltage output winding;

a first switch coupled to said power transformer second step-down voltage output winding for coupling only positive voltages from said power transformer to said filter circuit; and a second switch coupled to said power transformer second step-down voltage output winding for coupling only negative voltages to said filter circuit.

15. The apparatus of claim 14 further including:

first and second diodes coupled between said first end of said power transformer and said first and second switches, respectively;

said first diode being connected to said first switch and said second diode being connected to said second switch in opposite polarity to said first switch;

third and fourth diodes coupled between said second end of said power transformer and said first and second switches, respectively;

said third diode being connected to said first switch in parallel with said first diode and said fourth diode being connected to said second switch in parallel with said second diode; and the center tap of said transformer being coupled to said filter circuit.

16. The apparatus of claim 10 further including a phase-lag compensation circuit being coupled to said filter circuit for preventing oscillation of said apparatus.

* * * * *